United States Patent
Ramesh et al.

(10) Patent No.: US 11,144,203 B2
(45) Date of Patent: Oct. 12, 2021

(54) SELECTIVELY OPERABLE MEMORY DEVICE

(71) Applicant: Micron Technology, Inc., Boise, ID (US)

(72) Inventors: Vijay S. Ramesh, Boise, ID (US); Allan Porterfield, Durham, NC (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 16/701,281

(22) Filed: Dec. 3, 2019

(65) Prior Publication Data

US 2021/0165569 A1    Jun. 3, 2021

(51) Int. Cl.
*G06F 3/06* (2006.01)
*G11C 7/10* (2006.01)

(52) U.S. Cl.
CPC .......... *G06F 3/0604* (2013.01); *G06F 3/0644* (2013.01); *G06F 3/0673* (2013.01); *G11C 7/1078* (2013.01); *G11C 7/1051* (2013.01)

(58) Field of Classification Search
CPC .... G06F 3/0604; G06F 3/0644; G06F 3/0673; G11C 7/1078; G11C 7/1051
USPC ...................................................... 711/104
See application file for complete search history.

(56) References Cited

U.S. PATENT DOCUMENTS

| | | | |
|---|---|---|---|
| 8,438,455 B2 | 5/2013 | Vogan et al. | |
| 9,449,035 B2 | 9/2016 | Grossman et al. | |
| 9,477,295 B2 | 10/2016 | Jreji et al. | |
| 9,484,103 B1 | 11/2016 | Bruce et al. | |
| 2010/0017649 A1 | 1/2010 | Wu et al. | |
| 2015/0269017 A1* | 9/2015 | Ellis | G06F 11/0793 |
| | | | 714/42 |
| 2015/0371684 A1 | 12/2015 | Mataya | |
| 2019/0088349 A1* | 3/2019 | Pyo | G11C 29/42 |

* cited by examiner

*Primary Examiner* — Fernando Hidalgo
(74) *Attorney, Agent, or Firm* — Brooks, Cameron & Huebsch, PLLC

(57) ABSTRACT

Systems, apparatuses, and methods related to a selectively operable memory device are described. An example method corresponding to a selectively operable memory device can include receiving, by a resistance variable memory device, a command to operate the resistance variable memory device in a first mode or a second mode and operating the resistance variable memory device in the first mode or the second mode based, at least in part, on the received command to perform, in the first mode, a read operation or a write operation, or both, or, in the second mode, a compute operation. The method can further include performing, using a processing unit resident on the resistance variable memory device, the compute operation, the testing operation, or both based, at least in part, on a determination that the resistance variable memory device is operating in the second mode.

18 Claims, 4 Drawing Sheets

SELECTIVELY OPERABLE MEMORY DEVICE

TECHNICAL FIELD

The present disclosure relates generally to semiconductor memory and methods, and more particularly, to apparatuses, systems, and methods for a selectively operable memory device.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
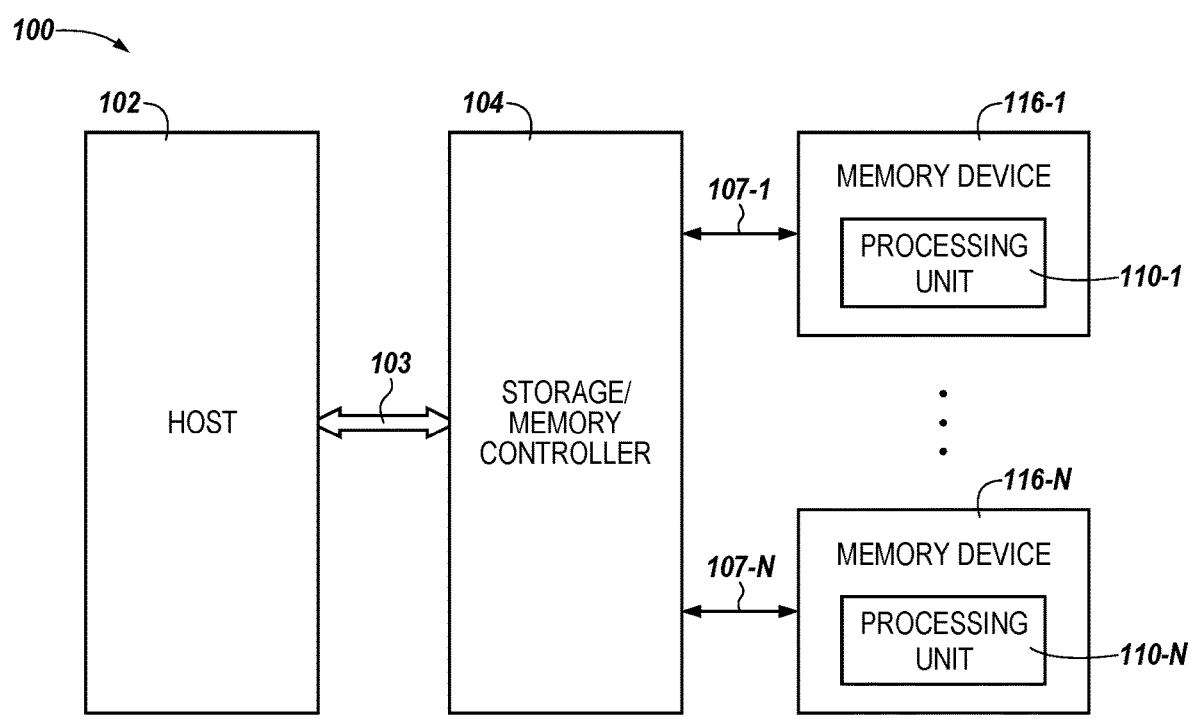
FIG. 1 is a functional block diagram in the form of a computing system including a storage/memory controller and a plurality of memory devices having respective processing units resident thereon in accordance with a number of embodiments of the present disclosure.

Systems, apparatuses, and methods related to a selectively operable memory device are described. An example method corresponding to a selectively operable memory device can include receiving, by a resistance variable memory device, a Systems, apparatuses, and methods related to a selectively operable memory device are described. An example method corresponding to a selectively operable memory device can include receiving, by a resistance variable memory device, a command to operate the resistance variable memory device in a first mode or a second mode and operating the resistance variable memory device in the first mode or the second mode based, at least in part, on the received command to perform, in the first mode, a read operation or a write operation, or both, or, in the second mode, a compute operation. The method can further include performing, using a processing unit resident on the resistance variable memory device, the compute operation, the testing operation, or both based, at least in part, on a determination that the resistance variable memory device is operating in the second mode.

Memory devices may be used to store important or critical data in a computing device and can transfer, via at least one memory interface, such data between a host associated with the computing device. However, as the size and quantity of data stored by memory devices increases, transferring the data to and from the host can become time consuming and resource intensive. For example, when a host requests performance of memory operations using large blocks of data (e.g., blocks of data on the order of 4 kilobytes (KB), 8 KB, etc.), an amount of time and/or an amount of resources consumed in obliging the request can increase in proportion to the size and/or quantity of data associated with the blocks of data.

As storage capability of memory devices increases, these effects can become more pronounced as more and more data are able to be stored by the memory device and are therefore available for use in memory operations. In addition, because data may be processed (e.g., memory operations may be performed on the data or using the data), as the amount of data that is able to be stored in memory devices increases, the amount of data that may be processed can also increase. This can lead to increased processing time and/or increased processing resource consumption, which can be compounded in performance of certain types of memory operations. In order to alleviate these and other issues, embodiments herein can allow for various operations to be performed on the data using a memory device, one or more computing devices, and/or memory array(s) in order to transfer data more efficiently from a computing device to a memory device and/or from a computing device to a host, and vice versa.

For example, in some embodiments, operations can be performed on data stored in a memory device within the memory device or near to the memory device (e.g., by a processing unit that is resident on the memory device in contrast to a central processing unit associated with a host) prior to the data being accessed by circuitry external to the memory device. By performing the operations on the data stored in the memory device within (or near to) the memory device, a quantity of clock cycles and/or an amount of time required to process the data can be reduced in comparison to approaches in which the data is transferred to circuitry external to the memory device (or to circuitry that is not near to the memory device), thereby improving the performance of the memory device and the computing system in which the memory device is deployed. As used herein, the term "resident on" refers to something that is physically located on a particular component. For example, the processing unit being "resident on" the memory device refers to a condition in which the processing unit is physically located on the memory device. The term "resident on" can be used interchangeably with other terms such as "deployed on" or "located on," herein.

That is, because some approaches can require multiple clock cycles and/or multiple function calls to memory of a computing system such as a memory device and/or memory array to move data around (e.g., in requesting and retrieving data) to perform operations on data stored by the memory device, a fixed amount of time may be consumed in transferring the data between the memory device and external circuitry to perform the operations on the data. Further, because some approaches can require that the data be transferred to circuitry that is deployed in a location other than the memory device (e.g., because some approaches can require that operations are performed on the data at a location that is neither resident on the memory device nor near the memory device), a fixed amount of time may be consumed in performing operations to transfer the data to suitable circuitry to perform the operations. Moreover, as the amount of data stored by the memory device increases due to increasing capacity of memory devices, the effects, such as the amount of time spent in transferring the data off the memory device (e.g., to circuitry that is neither resident on the memory device nor near the memory device) to perform operations can become further compounded.

In contrast, embodiments herein can allow for performance of memory operations on or near to the memory device, thereby reducing the quantity of clock cycles and/or function calls used to request data, retrieve data, and/or move the data from location to location within a computing system in comparison to approaches in which the data is transferred to circuitry external to, or far away from, the memory device. By reducing the quantity of clock cycles and/or function calls used to request data, retrieve data, and/or move data from location to location within a computing system, an amount of power consumed in performing memory operations can be reduced in comparison to approaches in which the data is transferred to circuitry external to, or far away from, the memory device.

In addition, by allowing for memory operations to be performed on or near to the memory device, embodiments herein can allow for a reduced amount of data (e.g., for pertinent data) to be retrieved for use by a host subsequent to performance of the memory operations. For example, in some approaches, a host may request a large (e.g., 4 KB, 8 KB, etc.) chunk of data for use in a host operation; however, the host may actually only require a particular pertinent portion of the large chunk of data. Therefore, by performing the memory operations on or near to the memory device prior to transferring the requested data to the host, a reduced quantity of data (e.g., only the pertinent data) may be transferred to the host, thereby reducing the amount of data and, hence, an amount of time and/or power consumed in transferring the data to the host in comparison to approaches that do not allow for performance of memory operations on or near to the memory device.

Embodiments herein can be facilitated via the assertion of signals and/or commands to the processing unit and/or memory device(s). The signals and/or commands can be indicative of an operational mode of the memory device(s). For example, a particular signal and/or command can be asserted to the processing unit and/or memory device(s) to cause the memory device(s) to operate in a first operational mode (e.g., a "normal" mode of operation in which the memory device(s) operate as storage and/or memory for the computing system), while a different signal and/or command can be asserted to the processing unit and/or memory device(s) to cause the memory device(s) to operate in a second operational mode (e.g., a "compute" mode of operation in which the memory device(s) and/or processing unit perform memory operations using data stored by the memory device(s). However, as will be described in more detail, herein, embodiments are not limited to assertion of the signals and/or commands described above. For example, in some embodiments, a signal and/or a command can be asserted to the processing unit and/or memory device(s) to cause the memory device(s) to operate in a "test" mode in which the processing unit and/or the memory device(s) perform testing operations on various hardware components (e.g., hardware accelerators, arithmetic logic units, neuromorphic processors, etc.) coupled to the processing unit and/or the memory device(s).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X," "N," "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 104 may reference element "04" in FIG. 1, and a similar element may be referenced as 204 in FIG. 2. A group or plurality of similar elements or components may generally be referred to herein with a single element number. For example, a plurality of reference elements 110-1, . . . , 110-N (or, in the alternative, 110-1 to 110-N) may be referred to generally as 110. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including a storage/memory controller 104 and a plurality of memory devices 116-1 to 116-N having respective processing units 110-1 to 110-N resident thereon in accordance with a number of embodiments of the present disclosure. The host 102, the storage controller 104, the memory device(s) 116, and/or the processing unit(s) 110 can be referred to separately or together as an apparatus. As used herein, an "apparatus" can refer to, but is not limited to, any of a variety of structures or combinations of structures, such as a circuit or circuitry, a die or dice, a module or modules, a device or devices, or a system or systems, for example.

In the embodiment illustrated in FIG. 1, memory devices 116-1 to 116-N can include one or more memory modules (e.g., double data rate (DDR) memory, three-dimensional (3D) cross-point memory, NAND memory, single in-line memory modules, dual in-line memory modules, etc.). The memory devices 116-1 to 116-N can include volatile memory and/or non-volatile memory. In a number of embodiments, memory devices 116-1 to 116-N can include a multi-chip device. A multi-chip device can include a number of different memory types and/or memory modules. For example, a memory system can include non-volatile or volatile memory on any type of a module.

The memory devices 116-1 to 116-N can provide main memory for the computing system 100 or could be used as additional memory or storage throughout the computing system 100. Each memory device 116-1 to 116-N can include one or more arrays of memory cells, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

In embodiments in which the memory devices 116-1 to 116-N include non-volatile memory, the memory devices 116-1 to 116-N can be flash memory devices such as NAND or NOR flash memory devices. Embodiments are not so limited, however, and the memory devices 116-1 to 116-N can include other non-volatile memory devices such as non-volatile random-access memory devices (e.g., NVRAM, ReRAM, FeRAM, MRAM, PCM), "emerging" memory devices such as variable resistance (e.g., 3-D Crosspoint (3D XP) memory devices), memory devices that include an array of self-selecting memory (SSM) cells, etc., or combinations thereof. Variable resistance memory devices can perform bit storage based on a change of bulk resistance, in conjunction with a stackable cross-gridded data access array. Additionally, in contrast to many flash-based memories, variable resistance non-volatile memory can perform a write in-place operation, where a non-volatile memory cell can be programmed without the non-volatile memory cell being previously erased. In contrast to flash-based memories and variable resistance memories, self-selecting memory cells can include memory cells that have a single chalcogenide material that serves as both the switch and storage element for the memory cell.

As illustrated in FIG. 1, the memory devices 116-1 to 116-N can include respective processing units 110-1 to 110-N. The processing units 110-1 to 110-N can be any type of processors, combination of co-processors, or the like that can be configured to perform processing operations on data stored by the memory devices 116-1 to 116-N. Non-limiting examples of processing units 110-1 to 110-N can include a full-Linux capable, cache-coherent 64-bit RISC-V processor, a U54-MC computing core, or other processing device configured to perform processing operations on the data stored by the memory devices 116-1 to 116-N.

The storage/memory controller 104 can by a non-volatile express (NVMe) media controller that can process command received from the host 102, the memory devices 116-1 to 116-N, and/or the processing units 110-1 to 110-N. For example, the storage/memory controller 104 can be a specialized memory controller that can perform operations to control the memory devices 116-1 to 116-N. For example, the storage/memory controller 104 can be configured to perform simple operations such as copy, write, read, error correct, etc. in addition to specialized operations such as wear leveling, garbage collection, error correction, etc. for the memory devices 116-1 to 116-N. However, in some embodiments, the storage/memory controller 104 does not perform processing (e.g., operations to manipulate data) on data associated with the memory devices 116-1 to 116-N. For example, the storage/memory controller 104 can cause a read and/or write operation to be performed to read or write data from or to the memory devices 116-1 to 116-N via the communication paths 107-1 to 107-N, but the storage/memory controller 104 may not perform processing on the data read from or written to the memory devices 116-1 to 116-N. In some embodiments, the storage/memory controller 104 can be a non-volatile memory controller, although embodiments are not so limited.

The host 102 and/or the storage/memory controller 104 can be configured to assert a signal and/or a command to the processing unit(s) 110-1 to 110-N and/or to the memory device(s) 116-1 to 116-N to cause the memory device(s) 116-1 to 116-N to be selectively operated between a variety of modes or operational states. Non-limiting examples of the various modes or operational states in which the memory device(s) 116-1 to 116-N can be operated include a "normal" mode of operation in which the memory device(s) 116-1 to 116-N are used as storage and/or memory for the computing system 100, a "compute" mode of operation in which the memory device(s) 116-1 to 116-N are used to perform memory operations using data stored thereby, etc.

When the signal and/or command is asserted to the processing unit(s) 110-1 to 110-N and/or to the memory device(s) 116-1 to 116-N to cause the memory device(s) 116-1 to 116-N to operate in the "compute" mode, the memory device(s) 116-1 to 116-N can selectively operate on the data stored thereby to cause at least some of the data to be ordered, reordered, removed, or discarded. The operations can be performed to remove irrelevant data, extract relevant data, or otherwise reduce a quantity of bits in the block of data. The block(s) of data can be approximately 4 kilobytes in size (although embodiments are not limited to this particular size) and can be processed in a streaming manner by the computing devices 110-1, . . . , 110-N in response to one or more commands generated by the controller 104 and/or a host and sent via the second communication subsystems 106. In some embodiments, the blocks of data can be 32-bit, 64-bit, 128-bit, etc. words or chunks of data, and/or the blocks of data can correspond to operands to be used in performance of the memory operations described herein.

In some embodiments, the operations can be performed to remove one or more columns of data from a data object that is stored in a columnar format. By processing the data using the memory device(s) 116-1 to 116-N and/or the processing units 110-1 to 110-N, a reduced quantity of data can be transferred to a location external to the memory device(s) 116-1 to 116-N (e.g., to the host 102 or to other circuitry external to the memory device(s) 116-1 to 116-N) thereby increasing the speed at which the data is transferred, reducing an amount of power consumed in transferring the data, and/or reducing a number of clock cycles or functions calls associated with transferring the data out of the memory device(s) 116-1 to 116-N.

Operations performed by the memory device(s) 116-1 to 116-N and/or the processing units 110-1 to 110-N are not, however, limited to the operations enumerated above. For example, in some embodiments, the memory device(s) 116-1 to 116-N and/or the processing units 110-1 to 110-N can perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or recursive logical operations such as AND, OR, XOR, NOT, etc., as well as trigonometric operations such as sine, cosine, tangent, etc. when the memory device(s) are operating in the "compute" mode. As will be appreciated, the foregoing list of operations is not intended to be exhaustive, nor is the foregoing list of operations intended to be limiting, and the memory device(s) 116-1 to 116-N and/or the processing units 110-1 to 110-N may be configured to perform (or cause performance of) other arithmetic, logical operations, bitwise operations, or other operations.

The storage/memory controller 104 can, in some embodiments, be further configured to send commands to synchronize performance of operations, such as memory operations, performed by the processing units 110-1 to 110-N and/or the memory devices 116-1 to 116-N. For example, storage/memory controller 104 (and/or the host 102) can assert a signal and/or a command to a first processing unit 110-1 to cause the first processing unit 110-1 and/or the first memory device 116-1 to perform a first operation, and the storage/memory controller 104 (or the host 102) can assert a signal and/or a command to a second processing unit 110-N to perform a second memory operation using the second processing unit 110-N and/or the second memory device 116-N. Synchronization of performance of operations, such as memory operations, performed by the processing units 110 by the storage/memory controller 104 can further include causing the processing units 110 to perform particular operations at particular time or in a particular order.

As described in more detail, herein, data that results from performance of a memory operation can be stored in the original address in the memory device 116 in which the data was stored prior to performance of the memory operation, however, in some embodiments, blocks of data that result from performance of the memory operation can be converted into logical records subsequent to performance of the memory operation. The logical records can comprise data records that are independent of their physical locations. For example, the logical records may be data records that point to an address (e.g., a location) in at least one of the memory devices 116 where physical data corresponding to performance of the memory operation is stored.

In some embodiments, the result of the memory operation can be stored in an address of a memory device 116 that is the same as the address in which the data is stored prior to performance of the memory operation. Embodiments are not so limited, however, and the result of the memory operation can be stored in an address of the memory device 116 that is different from the address in which the data is stored prior to performance of the memory operation. In some embodiments, the logical records can point to these address locations such that the result(s) of the extended memory operation can be accessed from the processing units 110 and transferred to circuitry external to the processing units 110 (e.g., to the host 102).

In some embodiments, the storage/memory controller 104 can receive and/or send blocks of data directly to and from the memory devices 116. This can allow the storage/memory controller 104 to transfer blocks of data that are not processed (e.g., blocks of data that are not used in performance of memory operations) by the processing units 110 and/or the memory devices 116 to and from the storage/memory controller 104 and/or the host 102.

For example, if the storage/memory controller 104 receives unprocessed blocks of data from a host 102 that are to be stored by memory device(s) 116, the storage/memory controller 104 can cause the unprocessed blocks of data to be transferred to the memory devices 116. Similarly, if the host 102 requests an unprocessed (e.g., a full) block of data (e.g., a block of data that is not processed by the processing units 110 and/or the memory devices 116), the storage/memory controller 104 can cause unprocessed blocks of data to be transferred to the host 102.

In a non-limiting embodiment in which the processing units 110-1 to 110-N and the respective memory devices 116-1 to 116-N are resistance variable memory devices on which respective processing units 110-1 to 110-N are deployed and are provided as an apparatus, the processing unit(s) 110-1 to 110-N can be configured to receive a first command to cause the resistance variable memory device 116-1 to 116-N to operate in a first mode in which the resistance variable memory device 116-1 to 116-N performs a read operation, or write operation, or both. In some embodiments, the processing unit(s) 110-1 to 110-N can be configured to receive a second command to cause the resistance variable memory device(s) 116-1 to 116-N to operate in a second mode in which the resistance variable memory device 116-1 to 116-N performs a compute operation. In response to receipt of the second command, the processing unit(s) 110-1 to 110-N can cause performance of an operation to modify data stored in a set of memory cells of the resistance variable memory device(s) 116-1 to 116-N. As described above, the operation can be an operation to remove irrelevant data, extract relevant data, or otherwise reduce a quantity of bits in the block of data, and/or and arithmetic operation, a bitwise operation, a logical operation, or other memory operation.

In some embodiments, the processing unit 110-1 to 110-N can be configured to cause performance of the operation by causing the data stored in the set of memory cells to be selectively transferred between a first portion of the resistance variable memory device 116-1 to 116-N and a second portion of the resistance variable memory device 116-1 to 116-N. The first portion of the resistance variable memory device 116-1 to 116-N and/or the second portion of the resistance variable memory device 116-1 to 116-N can refer to a group of memory cells associated with the resistance variable memory device 116-1 to 116-N. For example, the first portion of the resistance variable memory device 116-1 to 116-N and/or the second portion of the resistance variable memory device 116-1 to 116-N can refer to a subset of memory cells of the resistance variable memory device 116-1 to 116-N that may be smaller than a block of data stored by the resistance variable memory device 116-1 to 116-N.

The processing unit 116-1 to 116-N can be configured to receive signaling indicative of a particular type of operation to be invoked to modify the data stored in the set of memory cells and retrieve the data stored in the set of memory cells in response to receipt of the signaling. In some embodiments, the processing unit 110-1 to 110-N can perform (or cause performance of) the operation to modify the data in accordance with the received signaling and transfer (or cause transfer of) a result of the operation to modify the data to the resistance variable memory device. For example, in response to completion of the operation, the processing unit 110-1 to 110-N can transfer (or cause transfer of) the result of the operation to a location within the resistance variable memory device 116-1 to 116-N. In some embodiments, the location within the resistance variable memory device 116-1 to 116-N can be a same location in which the data was stored prior to performance of the operation. For example, the processing unit 110-1 to 110-N can be configured to transfer the result of the operation to modify the data to at least a portion of the set of memory cells of the resistance variable memory device 116-1 to 116-N in which the data was stored prior to performance of the operation.

In some embodiments, the processing unit 110-1 to 110-N can be configured to perform the operation to modify the data by selectively removing at least a portion of the data such that the portion of the data that is selectively removed is unrecoverable. For example, if the operation includes an operation to selectively remove irrelevant data or to extract relevant data, the processing unit 110-1 to 110-N can be configured to delete the irrelevant data such that the irrelevant data is unrecoverable.

The processing unit 110-1 to 110-N can be configured to cause a result of the operation to be transferred to a host 102 coupleable to the resistance variable memory device in the absence of a host command different from the first command or the second command. For example, the processing unit 110-1 to 110-N can be configured to determine that the operation is complete and transfer the result of the operation to the host 102 without requiring additional signaling or an additional command from the host 102. As a result, a quantity of signals and/or commands utilized in performing the operation and providing the result of the operation to the host 102 can be reduced in comparison to approaches in which the host 102 generates signals and/or commands to request the result of the operation in addition to the first and/or second command utilized to place the resistance variable memory device 116-1 to 116-N in the selected mode of operation.

In some embodiments, an apparatus can further include a processing unit (e.g., the processing unit 110-N) different than the processing unit described above (e.g., the processing unit 110-1). The different processing unit (e.g., 110-N) can be resident on a resistance variable memory device (e.g., the resistance variable memory device 116-N) different than the resistance variable memory device (e.g., the resistance variable memory device 116-1) on which the processing unit 110-1 is deployed. In such embodiments, the processing units 110-1 to 110-N can be configured to be in communication with one another to facilitate performance of the operation (or multiple sub-operations that are constituent portions of the operation). For example, the processing unit 110-1 can determine that the data is stored in a set of memory cells of the different resistance variable memory device 116-N, request the data from the different resistance variable memory device 116-N, and cause performance of the operation to modify the data stored in the different set of memory cells of the different resistance variable memory device 116-N based, at least in part, on receipt of the second command.

In another non-limiting example, the computing system 100 can include a host 102, a storage/memory controller 104 (which can be referred to for simplicity as a "controller") coupled to the host 102, and a plurality of resistance variable memory devices 116-1 to 116-N that each have at least one respective processing unit 110-1 to 110-N resident thereon. The respective processing units 110-1 to 110-N can be configured to receive signaling indicative of operation of the resistance variable memory device 116-1 to 116-N on which the respective processing unit 110-1 to 110-N is resident in a first mode or a second mode, and, responsive to the signaling, cause the resistance variable memory device 116-1 to 116-N on which the processing unit 110-1 to 110-N is resident to operate in the first mode or the second mode. In some embodiments, the respective processing units 110-1 to 110-N can be further configured to cause the resistance variable memory device 116-1 to 116-N on which the respective processing unit 110-1 to 110-N is resident to perform a memory operation in response to the received signaling being indicative of operation of the resistance variable memory device 116-1 to 116-N on which the processing unit 110-1 to 110-N is resident in the second mode.

As described above, at least one of the first mode or the second mode can be a "normal" mode of operation in which the resistance variable memory devices 116-1 to 116-N are operated as storage and/or memory devices for the computing system 100, while at least one of the other of the first mode or the second mode can be a "compute" mode of operation in which the resistance variable memory devices 116-1 to 116-N are operated to perform memory operations using data stored by the resistance variable memory devices 116-1 to 116-N.

In some embodiments, the respective processing units 110-1 to 110-N can be configured to receive the signaling from the host 102 and cause the memory device 116-1 to 116-N on which the respective processing unit 110-1 to 110-N is resident to perform the memory operation in the absence of an intervening signal from the host 102. For example, the processing units 110-1 to 110-N can be configured to perform the operation and/or transfer a result of the operation to the host 102 without requiring additional signaling or an additional command from the host 102. As a result, a quantity of signals and/or commands utilized in performing the operation and/or providing the result of the operation to the host 102 can be reduced in comparison to approaches in which the host 102 generates signals and/or commands to request the result of the operation in addition to the first and/or second command utilized to place the resistance variable memory device 116-1 to 116-N in the selected mode of operation.

The respective processing units 110-1 to 110-N can be configured to receive the signaling from the controller 104 and cause the memory device 116-1 to 116-N on which the respective processing unit 110-1 to 110-N is resident to perform the memory operation in the absence of an intervening signal from the controller 104. For example, the processing units 110-1 to 110-N can be configured to perform the operation and/or transfer a result of the operation to the controller 104 without requiring additional signaling or an additional command from the controller 104. As a result, a quantity of signals and/or commands utilized in performing the operation and/or providing the result of the operation to the controller 104 can be reduced in comparison to approaches in which the controller 104 generates signals and/or commands to request the result of the operation in addition to the first and/or second command utilized to place the resistance variable memory device 116-1 to 116-N in the selected mode of operation.

As described above, in some embodiments, the memory operation can include an arithmetic operation, a logical operation, an operation to modify data stored in a set of memory cells of the resistance variable memory device, or combinations thereof, although embodiments are not limited to these specific enumerated examples of memory operations.

The respective processing units 110-1 to 110-N can be configured to transfer a result of the memory operation to least a portion of a set of memory cells in which the data was stored prior to performance of the operation. In some embodiments, the respective processing units 110-1 to 110-N can be configured to cause performance of the memory operation by causing a data stored in the resistance variable memory device on which the respective processing unit is resident to be selectively transferred between a first portion of the resistance variable memory device and a second portion of the resistance variable memory device. The first portion of the resistance variable memory device 116-1 to 116-N and/or the second portion of the resistance variable memory device 116-1 to 116-N can refer to a group of memory cells associated with the resistance variable memory device 116-1 to 116-N. For example, the first portion of the resistance variable memory device 116-1 to 116-N and/or the second portion of the resistance variable memory device 116-1 to 116-N can refer to a subset of memory cells of the resistance variable memory device 116-1 to 116-N that may be smaller than a block of data stored by the resistance variable memory device 116-1 to 116-N.

In some embodiments, the respective processing units 110-1 to 110-N can be configured to receive the signaling from the host 102 and/or cause a result of the memory operation to be transferred to the host in the absence of an intervening command received from the host 102, the controller 104, or both. For example, the respective processing units 110-1 to 110-N can be configured to determine that the operation is complete and transfer the result of the operation to the host 102 and/or the controller 104 without requiring additional signaling or an additional command from the host 102 and/or the controller 104. As a result, a quantity of signals and/or commands utilized in performing the operation and providing the result of the operation to the host 102 and/or the controller 104 can be reduced in comparison to approaches in which the host 102 and/or the controller 104 generates signals and/or commands to request the result of the operation in addition to the first and/or second command utilized to place the resistance variable memory device 116-1 to 116-N in the selected mode of operation.

The host 102 can be a host system such as a personal laptop computer, a desktop computer, a digital camera, a smart phone, a memory card reader, and/or internet-of-things enabled device, among various other types of hosts, and can include a memory access device, (e.g., a processor or processing device). One of ordinary skill in the art will appreciate that "a processor" can intend one or more processors, such as a parallel processing system, a number of coprocessors, etc. The host 102 can include a system motherboard and/or backplane and can include a number of processing resources (e.g., one or more processors, microprocessors, or some other type of controlling circuitry). In some embodiments, the host can include a host controller, which can be configured to control at least some operations of the host 102 by, for example, generating and transferring commands to the host controller to cause performance of operations such as extended memory operations. The host controller can include circuitry (e.g., hardware) that can be configured to control at least some operations of the host 102. For example, the host controller can be an application specific integrated circuit (ASIC), a field programmable gate array (FPGA), or other combination of circuitry and/or logic configured to control at least some operations of the host 102.

The host 102 can be coupleable to the storage/memory controller 104 via an interface 103. The interface 103 can include a communication subsystem (e.g., a XBAR, or other communication subsystem configured to transfer data and/or commands between the host 102 and the storage/memory controller 104), a peripheral component interconnect express (PCIe) buses, double data rate (DDR) interface, interconnect interface (such as AXI interconnect interface), multiplexers (muxes), or other suitable interface or bus. Embodiments are not so limited, however.

The system 100 can include separate integrated circuits or the host 102, the storage/memory controller 104, the processing units 110-1 to 110-N, and/or the memory devices 116-1, . . . , 116-N can be on the same integrated circuit. The system 100 can be, for instance, a server system and/or a high performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture.

The embodiment of FIG. 1 can include additional circuitry that is not illustrated so as not to obscure embodiments of the present disclosure. For example, the computing system 100 can include address circuitry to latch address signals provided over I/O connections through I/O circuitry. Address signals can be received and decoded by a row decoder and a column decoder to access the memory devices 116-1 to 116-N. It will be appreciated by those skilled in the art that the number of address input connections can depend on the density and architecture of the memory devices 116-1 to 116-N.

Figure 2:
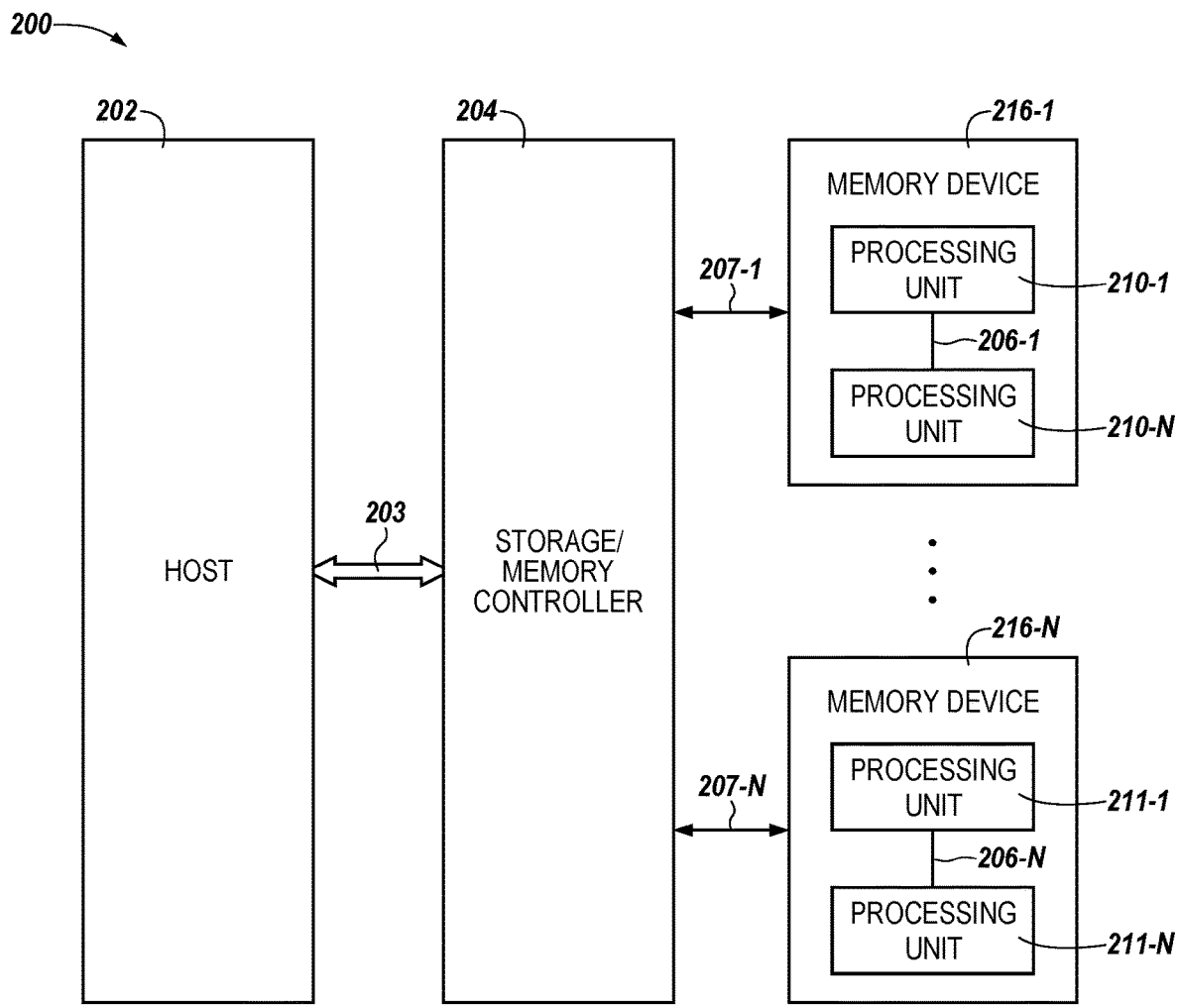
FIG. 2 is a functional block diagram in the form of a computing system including a storage/memory controller and a plurality of memory devices having respective pluralities processing units resident thereon in accordance with a number of embodiments of the present disclosure

FIG. 2 is a functional block diagram in the form of a computing system 200 including a storage/memory controller 204 and a plurality of memory devices 216-1 to 216-N having respective pluralities processing units 210-1 to 210-N and 211-1 to 211-N resident thereon in accordance with a number of embodiments of the present disclosure. The host 202, the storage/memory controller 204, the memory device(s) 216, and/or the processing unit(s) 210/211 can be referred to separately or together as an apparatus. As used herein, an "apparatus" can refer to, but is not limited to, any of a variety of structures or combinations of structures, such as a circuit or circuitry, a die or dice, a module or modules, a device or devices, or a system or systems, for example.

The host 202, storage/memory controller 204, the memory devices 216-1 to 216-N, and/or the processing units 210-1 to 210-N and/or 211-1 to 211-N can be analogous to the host 102, storage/memory controller 104, the memory devices 116-1 to 116-N, and/or the processing units 110-1 to 110-N illustrated and described above in connection with FIG. 1. As shown in FIG. 2, the storage/memory controller 204 can be coupled to the host 202 via an interface 203, which can be analogous to the interface 103 illustrated in FIG. 1. Further, the storage/memory controller 204 can be coupled to the memory devices 216-1 to 216-N via respective communication paths 207-1 to 207-N, which can be analogous to the communication paths 107-1 to 107-N illustrated in FIG. 1.

In contrast to the embodiments depicted in FIG. 1, the embodiments shown in FIG. 2 include multiple processing units 210-1 to 210-N and 211-1 to 211-N resident on the memory devices 216-1 to 216-N. The processing units 210-1 to 210-N resident on the memory device 261-1 can be coupled together via one or more interfaces 206-1, while the processing units 211-1 to 211-N resident on the memory device 216-N can be coupled together via one or more interfaces 206-N. The interfaces 206-1 to 206-N can include a communication subsystem (e.g., a XBAR, or other communication subsystem configured to transfer data and/or commands between the processing units 210-1 to 210-N and 211-1 to 211-N), a peripheral component interconnect express (PCIe) buses, double data rate (DDR) interface, interconnect interface (such as AXI interconnect interface), multiplexers (muxes), or other suitable interface or bus. Embodiments are not so limited, however.

In some embodiments, one or more of the processing units 210-1 to 210-N resident on the memory device 216-1 and/or one or more of the processing units 211-1 to 211-N resident on the memory device 216-N can receive signaling and/or a command to selectively operate the memory device(s) 216-1 to 216-N in various modes of operation. As described above, the modes of operation can include a "normal" mode of operation in which the memory devices 216-1 to 216-N operate as storage and/or memory for the computing system 200, a "compute" mode of operation, etc.

The processing units 210-1 to 210-N resident on the memory device 216-1 and/or one or more of the processing units 211-1 to 211-N resident on the memory device 216-N can operate individually or in concert to perform memory operations using data stored in the memory devices 216-1 to 21-N and/or to cause performance of memory operations using data stored in the memory devices 216-1 to 216-N. For example, in some embodiments, a first processing unit (e.g., the processing unit 210-1) can receive signaling and/or a command to cause the memory device 216-1 to operate in the compute mode to perform a memory operation using data stored by the memory device 216-1. Depending on the type and/or complexity of the memory operation to be performed, the processing unit 210-1 can perform the memory operation, cause the memory device 216-1 to perform the memory operation, and/or offload performance of a portion of the memory operation to a different processing unit (e.g., the processing unit 210-N).

Figure 3:
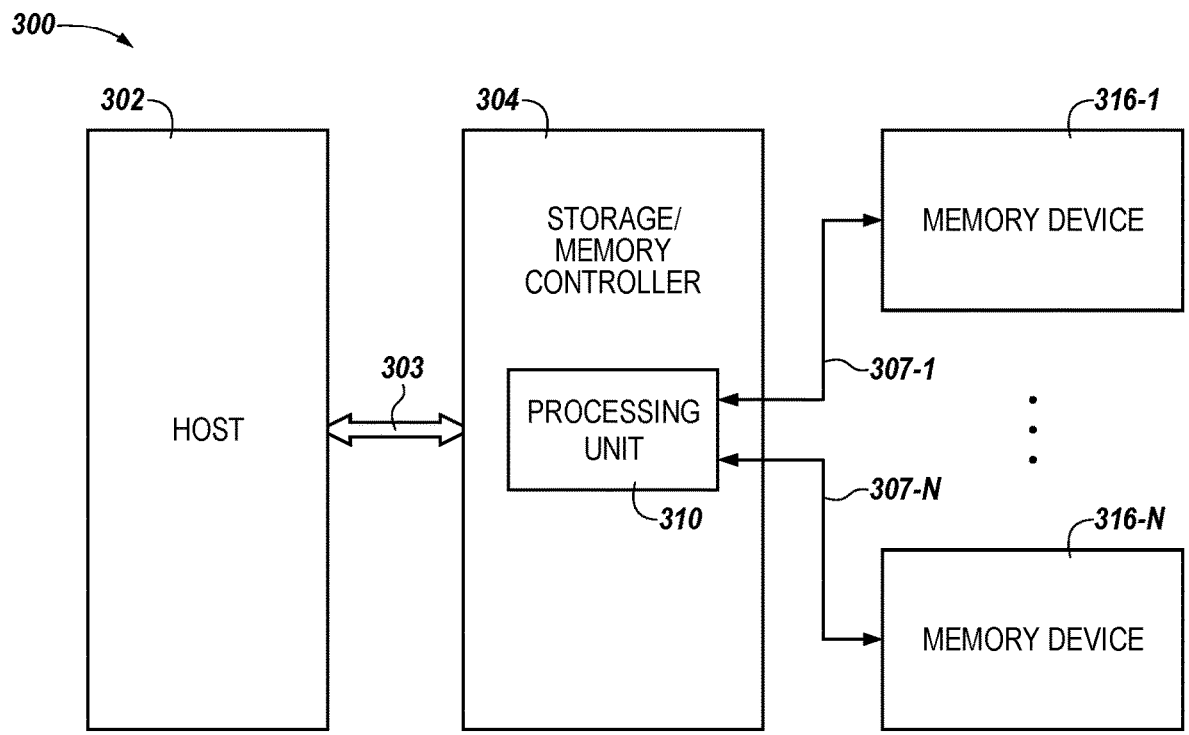
FIG. 3 is a functional block diagram in the form of a computing system including a storage/memory controller having a processing unit resident thereon and a plurality of memory devices in accordance with a number of embodiments of the present disclosure.

FIG. 3 is a functional block diagram in the form of a computing system 300 including a storage/memory controller 304 having a processing unit 310 resident thereon and a plurality of memory devices 316-1 to 316-N in accordance with a number of embodiments of the present disclosure. The host 302, the storage/memory controller 304, the processing unit 310, and/or the memory devices 316-1 to 316-N can be referred to separately or together as an apparatus.

The host 302, storage/memory controller 304, the memory devices 316-1 to 316-N, and/or the processing unit 310 can be analogous to the host 102, storage/memory controller 104, the memory devices 116-1 to 116-N, and/or the processing unit(s) 110-1 to 110-N illustrated and described above in connection with FIG. 1. As shown in FIG. 3, the storage/memory controller 304 can be coupled to the host 302 via an interface 303, which can be analogous to the interface 103 illustrated in FIG. 1. Further, the storage/memory controller 304 and/or the processing unit 310 can be coupled to the memory devices 316-1 to 316-N via respective communication paths 307-1 to 307-N, which can be analogous to the communication paths 107-1 to 107-N illustrated in FIG. 1.

Figure 4:
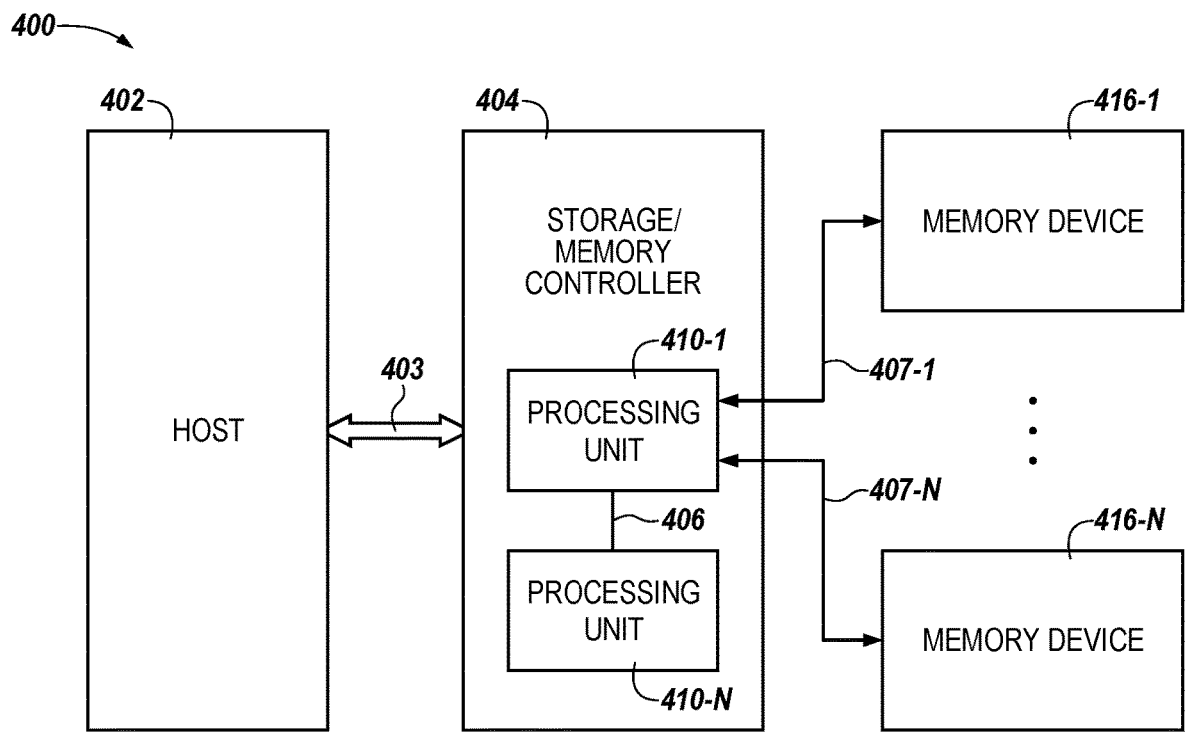
FIG. 4 is a functional block diagram in the form of a computing system including a storage/memory controller having a plurality of processing units resident thereon and a plurality of memory devices in accordance with a number of embodiments of the present disclosure.

FIG. 4 is a functional block diagram in the form of a computing system 400 including a storage/memory controller 404 having a plurality of processing units 410-1 to 410-N resident thereon and a plurality of memory devices 416-1 to 416-N in accordance with a number of embodiments of the present disclosure. The host 402, the storage/memory controller 404, the processing units 410-1 to 410-N, and/or the memory devices 416-1 to 416-N can be referred to separately or together as an apparatus.

The host 402, storage/memory controller 404, the memory devices 416-1 to 416-N, and/or the processing units 410-1 to 410-N can be analogous to the host 102, storage/memory controller 104, the memory devices 116-1 to 116-N, and/or the processing unit(s) 110-1 to 110-N illustrated and described above in connection with FIG. 1. As shown in FIG. 4, the storage/memory controller 404 can be coupled to the host 402 via an interface 403, which can be analogous to the interface 103 illustrated in FIG. 1. Further, the storage/memory controller 404 and/or the processing unit 410 can be coupled to the memory devices 416-1 to 416-N via respective communication paths 407-1 to 407-N, which can be analogous to the communication paths 107-1 to 107-N illustrated in FIG. 1. In some embodiments, the processing units 410-1 to 410-N can be communicatively coupled to one another via one or more interfaces 406. The interface(s) 406 can include a communication subsystem (e.g., a XBAR, or other communication subsystem configured to transfer data and/or commands between the processing units 410-1 to 410-N), a peripheral component interconnect express (PCIe) buses, double data rate (DDR) interface, interconnect interface (such as AXI interconnect interface), multiplexers (muxes), or other suitable interface or bus. Embodiments are not so limited, however.

Figure 5:
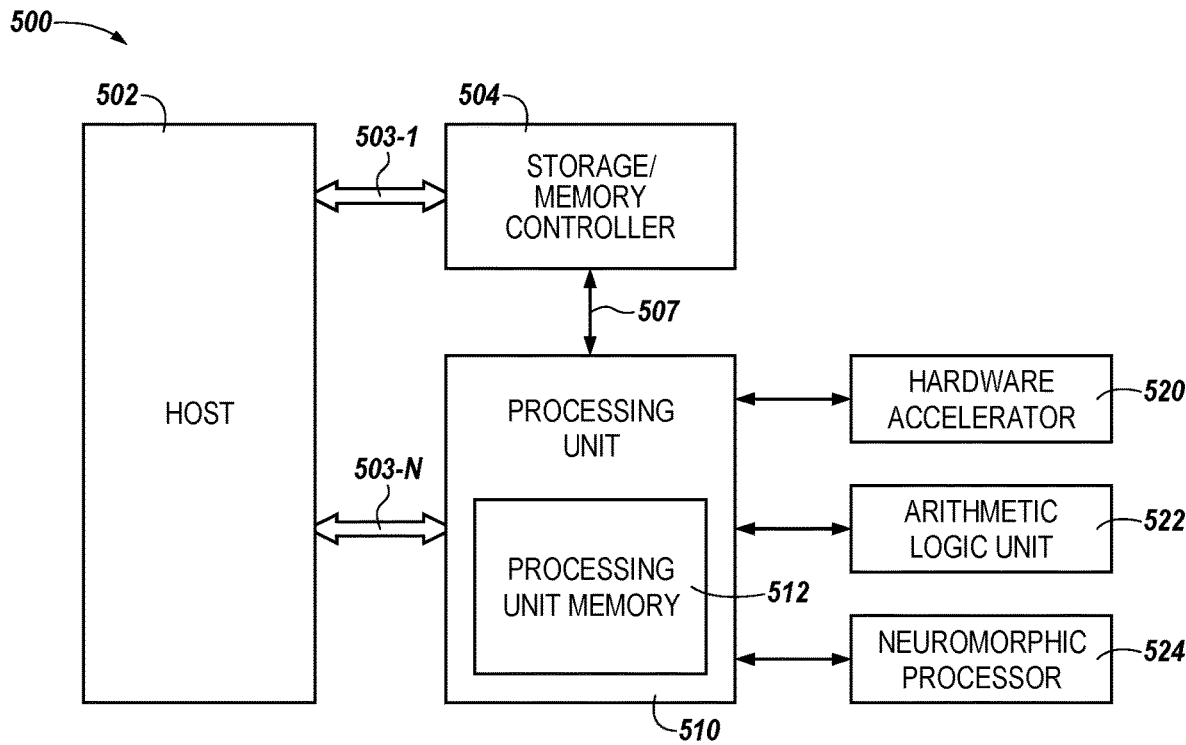
FIG. 5 is a functional block diagram in the form of a computing system including a processing unit, a storage/memory controller, and a hardware accelerator in accordance with a number of embodiments of the present disclosure.

FIG. 5 is a functional block diagram in the form of a computing system 500 including a processing unit 510, a storage/memory controller 504, and a hardware accelerator 520 in accordance with a number of embodiments of the present disclosure. As shown in FIG. 5, the processing unit 510 can include a process unit memory (e.g., a "PROC. UNIT MEMORY) 512. The processing unit memory 512 can, in some embodiments, be a memory resource such as random-access memory (e.g., RAM, SRAM, etc.). Embodiments are not so limited, however, and the processing unit memory 512 can include various registers, caches, buffers, and/or memory arrays (e.g., 1T1C, 2T2C, 3T, etc. DRAM arrays). For example, the processing unit memory 512 can include volatile memory resource, non-volatile memory resources, or a combination of volatile and non-volatile memory resources. In some embodiments, the process unit memory 512 can be a cache, one or more registers, NVRAM, ReRAM, FeRAM, MRAM, PCM), a resistance variable memory device such as 3-D Crosspoint (3D XP) memory devices, etc., or combinations thereof.

The processing unit memory 512 can be partitioned into one or more addressable memory regions. For example, the processing unit memory 512 can be partitioned into addressable memory regions so that various types of data can be stored therein. For example, one or more memory regions can store instructions used by the processing unit 510 and/or commands used by the processing unit 510. In some embodiments, the processing unit memory 512 can be used to store data retrieved from a memory device (e.g., the memory devices 116-1 to 116-N illustrated in FIG. 1, herein) as part of performance of a memory operation performed by the processing unit 510.

The processing unit 510 can be coupled to one or more hardware devices, such as a hardware accelerator 520, an arithmetic logic unit 522, and/or a neuromorphic processor 524. Some examples of a hardware accelerator 520 include sounds processing units (e.g., sound cards), graphics processing units (GPUs or "graphics cards"), digital signal processing units, analog signal processing units, computer networking processing units (e.g., networks on a chip, TCP offload engines, I/O acceleration processing units, etc.), cryptography processing units (e.g., cryptographic accelerator units, which can provide hardware-based encryption and/or decryption), artificial intelligence processing units (e.g., vision processing units, neural network processing units, etc.), tensor processing units, physics processing units, regular expression processing units, and/or data compression acceleration units, among others. The hardware accelerator 520 can be provided as computer hardware in the form of a field-programmable gate array (FPGA), an application-specific integrated circuit (ASIC), and/or a complex programmable logic device, a system-on-chip, among others. It will be appreciated that the foregoing enumerated examples of hardware accelerators and specifically enumerated examples of computer hardware are neither limiting nor exhaustive, and other hardware accelerators and/or computer hardware are contemplated within the scope of the disclosure.

The arithmetic logic unit (ALU) 522 can include a combinational digital electronic circuit that can perform operations such as arithmetic operations, logical operations, bitwise operations, etc. on data stored by the memory device(s). In some embodiments, the ALU can be configured to perform such operations in response to receipt of signaling and/or commands generated by the processing unit 510, the storage/memory controller 504, the host 502, and/or the memory devices.

The neuromorphic processor 524 can be a hardware device configured to mimic neuro-biological architectures present in the nervous system. In some embodiments, the neuromorphic processor 524 can be configured to perform machine learning algorithms in a manner such that the neuromorphic processor 524 can be trained to perform operations based on previously learned scenarios, patterns, or other learnable criteria.

As described above, the processing unit 510 can receive signaling and/or commands that be indicative of an operating mode of a memory device coupled to the processing unit. For example, the processing unit 510 can receive signaling and/or a command that instructs the processing unit 510 and/or the memory device to operate in a particular mode of operation. Once the particular mode of operation has been indicated by the signaling and/or the command, the processing unit 510 and/or a memory device can be used to perform operations in line with the operating mode indicated by the signaling and/or the command.

If the signaling and/or the command in indicative of a "test" or "testing" mode of operation, the processing unit 510 and/or the memory device can be operated to perform testing operations on various hardware components associated with the computing system 500. For example, the processing unit 510 and/or the memory device can be operated to test various performance attributes and/or operating characteristics of the hardware accelerator 520, the arithmetic logic unit 522, and/or the neuromorphic processor 524. The testing can include testing different hardware components (e.g., different hardware accelerators, etc.) under similar computing system performance characteristics to determine whether particular hardware components are better suited to certain tasks than other hardware components.

In a non-limiting example, the processing unit 510 can receive signaling and/or a command indicative of operating a memory device in a "test" or "testing" mode of operation. In response, the processing unit 510 and/or the memory device can enter the "test" or "testing" mode of operation and begin performing one or more tests using the hardware accelerator 520, the arithmetic logic unit 522, and/or the neuromorphic processor 524. For simplicity, an example in which there are multiple hardware accelerators 520 follows, however, it will be appreciated that similar techniques could be applied to the other hardware components (e.g., the arithmetic logic unit 522 and/or the neuromorphic processor 524) as part of performing a testing operation using the example system 500 shown in FIG. 5.

Continuing with this example, the processing unit 510 can monitor the hardware accelerators 520 during performance of tasks performed by the hardware accelerators 520 to determine which hardware accelerators 520 perform certain tasks better or worse than other hardware accelerators 520. For example, a particular task may be assigned to each of the hardware accelerators 520 by the processing unit 510. The processing unit 510 can then monitor the speed, power consumption, accuracy, or other characteristics associated with the performance of the hardware accelerators 520 during performance of the task to determine which, if any, of the hardware accelerators 520 perform the task better than others (e.g., faster, with less power consumption, with a higher degree of accuracy, etc.).

The processing unit 510 can then cause information collected during the testing operation to be stored in the processing unit memory 512 for use during performance of the particular task at a later time. For example, if, after the task has been performed, the processing unit 510 determines that a first hardware accelerator performs the task more efficiently than a second hardware accelerator, the processing unit 510 can store information indicative of the increased performance by the first hardware accelerator in performing that particular task. Should the same (or a similar) task be called at a later time, the processing unit 510 can assign that task to the hardware accelerator 520 (e.g., the first hardware accelerator) based on the information stored in the processing unit memory 512.

Figure 6:
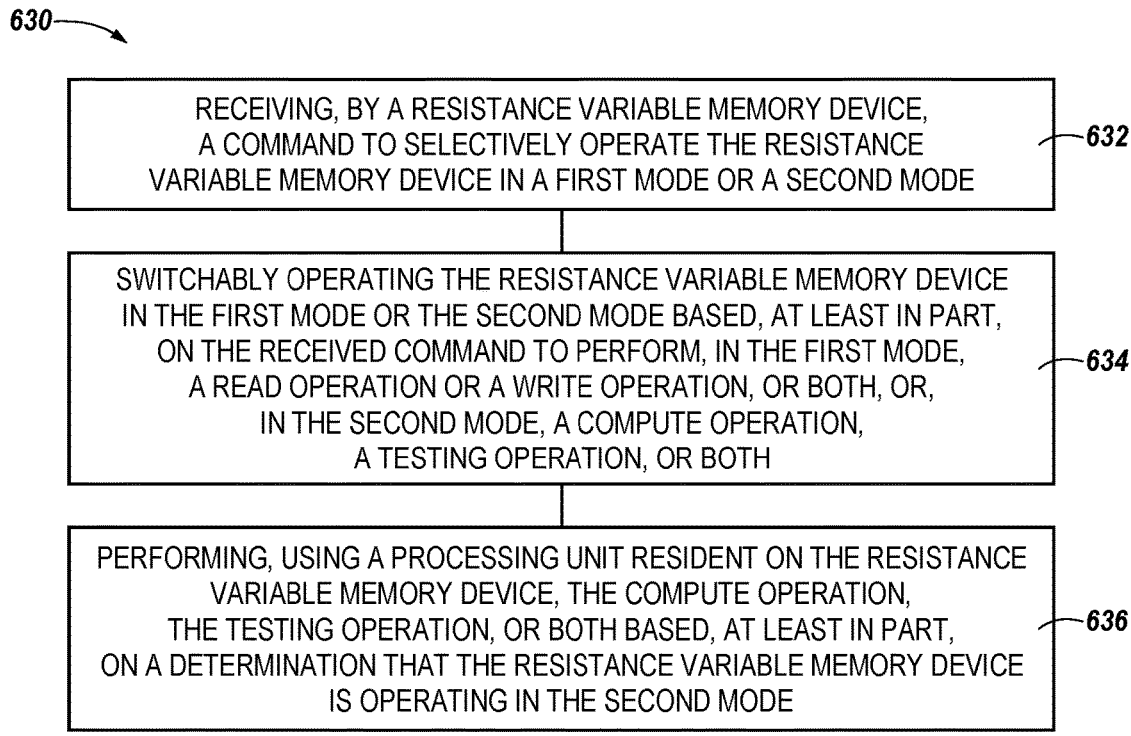
FIG. 6 is a flow diagram representing an example method corresponding to a selectively operable memory device in accordance with a number of embodiments of the present disclosure.

FIG. 6 is a flow diagram 630 representing an example method corresponding to a selectively operable memory device in accordance with a number of embodiments of the present disclosure. The method 630 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 632, the method 630 can include receiving, by a resistance variable memory device, a command to operate the resistance variable memory device in a first mode or a second mode. The resistance variable memory device can be analogous to the memory devices 116-1 to 116-N/216-1 to 216-N/316-1 to 316-N/416-1 to 416-N illustrated in FIGS. 1-4, herein. As described above, the first mode, the second mode, etc. can include a "normal" mode of operation in which the memory device(s) operate as storage and/or memory for the computing system, a "compute" mode of operation in which the memory device(s) perform memory operations using data stored by the memory device(s), and/or a "test" mode in which the processing unit and/or the memory device(s) perform testing operations on various hardware components operation, among other modes.

At block 634, the method 630 can include operating the resistance variable memory device in the first mode or the second mode based, at least in part, on the received command to perform, in the first mode, a read operation or a write operation, or both, or, in the second mode, a compute operation, a testing operation, or both. In some embodiments, the command to selectively operate the resistance variable memory device in the first mode or the second mode can be received from a host computing device (e.g., the host 102/202/302/402/502 illustrated in FIGS. 1-5, herein) coupleable to the resistance variable memory device in response to a request invoking a specified function generated at the host computing device.

At block 636, the method 630 can include performing, using a processing unit resident on the resistance variable memory device, the compute operation, the testing operation, or both based, at least in part, on a determination that the resistance variable memory device is operating in the second mode.

In some embodiments, the method 630 can include performing an operation to modify data stored in a set of memory cells of the resistance variable memory device by selectively removing data or selectively re-ordering the data, or both as part of performing the compute operation. Embodiments are not so limited, however, and in some embodiments, the method 630 can include performing an operation to modify data stored in a set of memory cells of the resistance variable memory device by performing a logical operation using at least a portion of the data as an operand for the logical operation.

The method 630 can include storing data that results from performance of the compute operation, the testing operation, or both in the resistance variable memory device in response to a determination that the compute operation, the testing operation, or both is complete. For example, the data that results from performance of the compute operation, the testing operation, or both, can be stored in the resistance variable memory device in the absence of an intervening command generated by the host or the processing unit, etc. Embodiments are not so limited, however, and in some embodiments, the method 630 can include transferring data that results from performance of the compute operation, the testing operation, or both to circuitry external to the resistance variable memory device and the processing unit in response to receipt of a host request to transfer the data that results from the compute operation, the testing operation, or both.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:

receiving, by a first resistance variable memory device comprising a plurality of self-selecting memory cells, a command to operate the resistance variable memory device in a first mode or a second mode;

operating the resistance variable memory device in the first mode or the second mode based, at least in part, on the received command to perform, in the first mode, a read operation or a write operation, or both, or, in the second mode, a compute operation to modify data stored in a set of self-selecting memory cells of the resistance variable memory device by removing data from at least one column of a data object stored in the set of self-selecting memory cells;

performing, using a first processing unit resident on the resistance variable memory device, the compute operation based, at least in part, on a determination that the resistance variable memory device is operating in the second mode;

determining, by the first processing unit that at least a portion of the data is stored in a set of memory cells of a second resistance variable memory device comprising a second processing unit;

requesting, by the first processing unit, the data from the second resistance variable memory device; and causing, by the first processing unit, performance of an operation to modify the data stored in the set of memory cells of the second resistance variable memory device based, at least in part, on receipt of the second command.

2. The method of claim 1, further comprising performing an operation to modify data stored in a set of memory cells of the resistance variable memory device by performing a logical operation using at least a portion of the data as an operand for the logical operation.

3. The method of claim 1, wherein the command to operate the resistance variable memory device in the first mode or the second mode is received from a host computing device coupleable to the resistance variable memory device in response to a request invoking a specified function generated at the host computing device.

4. The method of claim 1, further comprising storing data that results from performance of the compute operation in the resistance variable memory device in response to a determination that the compute operation complete.

5. The method of claim 1, further comprising transferring data that results from performance of the compute operation to circuitry external to the resistance variable memory device and the processing unit in response to receipt of a host request to transfer the data that results from the compute operation.

6. An apparatus, comprising:
a first processing unit resident on a first resistance variable memory device that comprises a plurality of self-selecting memory cells and
a second processing unit resident on a second resistance variable memory device, wherein the first processing unit is configured to:
receive a first command to cause the first resistance variable memory device to operate in a first mode in which the first resistance variable memory device performs a read operation, or write operation, or both;
receive a second command to cause the first resistance variable memory device to operate in a second mode in which the first resistance variable memory device performs a compute operation;
cause performance of an operation to modify data stored in a set of self-selecting memory cells of the first resistance variable memory device;
determine that the data is stored in a set of memory cells of the second resistance variable memory device;
request the data from the second resistance variable memory device; and
cause performance of an operation to modify the data stored in the set of memory cells of the second resistance variable memory device based, at least in part, on receipt of the second command by removing at least one column of data from a data object stored in the set of self-selecting memory cells based, at least in part, on receipt of the second command.

7. The apparatus of claim 6, wherein the processing unit is configured to cause performance of the operation by causing the data stored in the set of memory cells to be transferred between a first portion of the resistance variable memory device and a second portion of the resistance variable memory device.

8. The apparatus of claim 6, wherein the processing unit is configured to:
receive signaling indicative of a particular type of operation to be invoked to modify the data stored in the set of memory cells;
retrieve the data stored in the set of memory cells in response to receipt of the signaling;
perform the operation to modify the data in accordance with the received signaling; and
transfer a result of the operation to modify the data to the resistance variable memory device.

9. The apparatus of claim 8, wherein the processing unit is configured to transfer the result of the operation to modify the data to at least a portion of the set of memory cells in which the data was stored prior to performance of the operation.

10. The apparatus of claim 6, wherein the processing unit is configured to perform the operation to modify the data by removing at least the portion of the data such that the portion of the data that is removed is unrecoverable.

11. The apparatus of claim 6, wherein the processing unit is configured to cause a result of the operation to be transferred to a host coupleable to the resistance variable memory device in the absence of a host command different from the first command or the second command.

12. A system, comprising:
a host;
a controller coupled to the host;
a plurality of resistance variable memory devices comprising a plurality of self-selecting memory cells coupled to the controller and having a respective processing unit resident thereon, wherein the respective a first processing unit resident on a first resistance variable memory device among the plurality of resistance variable memory devices is configured to:
receive signaling indicative of operation of the first resistance variable memory device on which the first processing unit is resident in a first mode or a second mode;
responsive to the signaling, cause the first resistance variable memory device on which the first processing unit is resident to operate in the first mode or the second mode;
cause the first resistance variable memory device on which the first processing unit is resident to perform a memory operation to remove data from a data object stored in a set of self-selecting memory cells of at least one resistance variable memory device among the plurality of memory devices in response to the received signaling being indicative of operation of the first resistance variable memory device on which the first processing unit is resident in the second mode;
determine that the data object is stored in a set of memory cells of a second resistance variable memory device;
request the data from the second resistance variable memory device; and
cause performance of an operation to modify the data object stored in the set of memory cells of the second resistance variable memory device based, at least in part, on receipt of the second command.

13. The system of claim 12, wherein the respective processing units are configured to:
receive the signaling from the host; and
cause the memory device on which the respective processing unit is resident to perform the memory operation in the absence of an intervening signal from the host.

14. The system of claim 12, wherein the respective processing units are configured to:
receive the signaling from the controller; and
cause the memory device on which the respective processing unit is resident to perform the memory operation in the absence of an intervening signal from the controller.

15. The system of claim 12, wherein the memory operation comprises an arithmetic operation, a logical operation, an operation to modify data stored in a set of memory cells of the resistance variable memory device, or combinations thereof.

16. The system of claim 12, wherein the respective processing units are configured to transfer a result of the memory operation to least a portion of a set of memory cells in which the data was stored prior to performance of the operation.

17. The system of claim 12, wherein the respective processing units are configured to cause performance of the memory operation by causing a data stored in the resistance variable memory device on which the respective processing unit is resident to be transferred between a first portion of the resistance variable memory device and a second portion of the resistance variable memory device.

18. The system of claim 12, wherein the respective processing units are configured to:
   receive the signaling from the host; and
   cause a result of the memory operation to be transferred to the host in the absence of an intervening command received from the host, the controller, or both.

* * * * *